(12) United States Patent
Dangler et al.

(10) Patent No.: US 9,060,433 B2
(45) Date of Patent: Jun. 16, 2015

(54) THERMAL DISSIPATIVE RETRACTABLE FLEX ASSEMBLY

(71) Applicant: International Business Machines Corporation, Armonk, NY (US)

(72) Inventors: John R. Dangler, Rochester, MN (US); Matthew S. Doyle, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 393 days.

(21) Appl. No.: 13/734,501

(22) Filed: Jan. 4, 2013

(65) Prior Publication Data

US 2014/0192483 A1   Jul. 10, 2014

(51) Int. Cl.
*H05K 7/20* (2006.01)
*H05K 1/02* (2006.01)

(52) U.S. Cl.
CPC .............. *H05K 1/028* (2013.01); *H05K 1/0209* (2013.01); *H05K 2201/051* (2013.01); *H05K 2201/09781* (2013.01); *H05K 2201/2036* (2013.01)

(58) Field of Classification Search
CPC  H05K 1/0209; H05K 1/028; H05K 2201/051
See application file for complete search history.

(56) References Cited

U.S. PATENT DOCUMENTS

| | | | | |
|---|---|---|---|---|
| 2,980,874 | A | * | 4/1961 | Tarbox .......................... 336/192 |
| 3,300,572 | A | * | 1/1967 | Dahlgren et al. ............... 174/69 |
| 3,563,481 | A | | 2/1971 | Stahmer |
| 4,260,963 | A | * | 4/1981 | Drapac .......................... 333/26 |
| 4,509,109 | A | * | 4/1985 | Hansen ......................... 363/126 |
| 4,783,359 | A | * | 11/1988 | Fleischer et al. .............. 428/209 |
| 4,991,793 | A | | 2/1991 | Belsley et al. |
| 5,747,743 | A | * | 5/1998 | Kato et al. .................... 174/254 |
| 5,898,569 | A | | 4/1999 | Bhatia |
| 6,307,746 | B1 | | 10/2001 | Beckman |
| 6,329,600 | B1 | | 12/2001 | De Buyst |
| 6,452,093 | B1 | | 9/2002 | Ishii et al. |
| 6,483,033 | B1 | | 11/2002 | Simoes et al. |
| 7,298,619 | B1 | | 11/2007 | Malone et al. |
| 2010/0170692 | A1 | * | 7/2010 | Lu et al. .......................... 174/69 |

FOREIGN PATENT DOCUMENTS

| | | |
|---|---|---|
| JP | 6342683 A | 12/1994 |
| JP | 2000215737 A | 8/2000 |
| JP | 2010257729 A | 11/2010 |
| JP | 2012060769 A | 3/2012 |

* cited by examiner

*Primary Examiner* — Robert J Hoffberg
(74) *Attorney, Agent, or Firm* — Trentice V. Bolar; Grant Johnson

(57) ABSTRACT

Embodiments of the present invention provide an apparatus comprising a flexible circuit having a proximal end, a distal end, and a plurality of longitudinal conductors. Further, the apparatus includes a substantially cylindrical retractor capable of retracting the flexible circuit around an exterior surface. Further still, the apparatus includes a plurality of thermal energy transfer turrets attached to the flexible circuit near the plurality of longitudinal conductors.

19 Claims, 3 Drawing Sheets

THERMAL DISSIPATIVE RETRACTABLE FLEX ASSEMBLY

FIELD OF THE INVENTION

The present invention relates generally to the field of flexible circuits, and specifically to a structure for a thermal dissipative retractable flexible circuit assembly.

BACKGROUND OF THE INVENTION

Flexible circuitry (flex circuits) is a technology for assembling electronic circuits by mounting conductive layers and electronic devices on flexible polymer substrates. Typically, the conductive layer is sandwiched between two insulating layers. Flex circuits are used as a form of interconnection in applications requiring size and weight reduction, controlled impedance, reduced labor, and ease of assembly. Moreover, flex circuits can interconnect rigid boards, displays, connectors and various other components in a three-dimensional package. Flex circuits can be used as one-to-one connectors or as complex harnesses, allowing breakouts and special routing. Further, flex circuits can be bent-folded or shaped to interconnect multiple planes or to conform to specific package sizes.

Flex circuits also have the ability to connect moving components, a prime requirement in server drawers, disk drives, printer heads and other moving electronic assemblies. Furthermore, flex circuits may be designed to transmit an electric signal and/or electric power. However, existing vendor offerings exhibit limitations in their electric power delivery solutions, for example, increasing the conductive cross-sectional area to increase the transmission of electric power.

SUMMARY

Embodiments of the present invention provide an apparatus comprising a flexible circuit having a proximal end, a distal end, and a plurality of longitudinal conductors. Further, the apparatus includes a substantially cylindrical retractor capable of retracting the flexible circuit around an exterior surface. Further still, the apparatus includes a plurality of thermal energy transfer turrets attached to the flexible circuit near the plurality of longitudinal conductors.

In certain embodiments, the plurality of thermal energy transfer turrets are adjacent to the plurality of longitudinal conductors.

In other embodiments, the retractor comprises a grounded, thermally conductive polymer.

In certain embodiments, the retractor comprises a plurality of radial ventilation holes between the exterior surface and an interior of the retractor arranged in a perforation pattern. In other embodiments, the perforation pattern is adjacent to an area of relatively high thermal activity in the flexible circuit.

In other embodiments, the flexible circuit comprises an insulating layer wherein the insulating layer comprises a dielectric substrate with at least one of the following characteristics: low dielectric constant, low dissipation factor, an ability to withstand high operating temperatures, a high insulation resistance, and high surface resistivity. In still other embodiments, the insulating layer is chosen from the group consisting of: a polyimide film; a polyester film; an aramid; a reinforced composite; and a fluorocarbon.

In additional embodiments, the apparatus further comprises a riser element coupled longitudinally to the flexible circuit, wherein the riser element separates a plurality of layers of the flexible circuit when the flexible circuit is retracted around the retractor. In certain embodiments, the riser element is comprised of a material chosen from the group consisting of: foam, a polyimide, polyester, an aramid, a reinforced composite, or a fluorocarbon. In other embodiments, the apparatus further comprises a heat sink integrated into an interior surface of the retractor.

In still other embodiments, the heat sink comprises a plurality of radial fins extending inwardly from the interior surface. In additional embodiments, the plurality of thermal energy transfer turrets are positioned to improve thermal energy dissipation. In certain embodiments, the plurality of thermal energy transfer turrets are spaced longitudinally along a peripheral edge of the flexible circuit such that none of the plurality of thermal energy transfer turrets is in contact with another turret when the flexible circuit is retracted around the retractor. In other embodiments, the apparatus further comprises an electric insulator coating the plurality of thermal energy transfer turrets.

In still other embodiments, the plurality of thermal energy transfer turrets comprises material that a longitudinal conductor included in the plurality of longitudinal conductors is comprised of. In additional embodiments, the plurality of thermal energy transfer turrets comprises extensions of a longitudinal conductor included in the plurality of longitudinal conductors. In certain embodiments, the plurality of thermal energy transfer turrets comprises material chosen from the group consisting of: aluminum; copper; diamond; copper-tungsten; dymalloy; E-Material; and a thermal conductive material.

DETAILED DESCRIPTION

Before the present invention is described in further detail, it is to be understood that the invention is not limited to the particular embodiments described, as such may, of course, vary. It is also to be understood that the terminology used herein is for the purpose of describing particular embodiments only, and is not intended to be limiting, since the scope of the present invention will be limited only by the appended claims.

One embodiment of the invention comprises a thermal dissipative retractable flex circuit assembly. In moving electronic assemblies, for example, a server drawer, disk drives, printer heads and other moving electronic assemblies, a flex circuit can connect moving components by assuming a three-dimensional structure. Depending on the particular application, a flex circuit may transmit electric power, via a power trace and/or an electric signal, via a signal trace. However, when electrical power is conveyed through a flex circuit, thermal energy (i.e., heat) is generated due to resistive losses in the insulation. Resistivity is the measure of a material's ability to oppose an electric current. Hence, when a flex circuit transmits electric power, multiple wrappings of the flex circuit, for example, around a retractor, act as buried power planes that hinder thermal energy dissipation. In some cases, generated thermal energy may cause the temperature of the flex circuit to rise to a level that may damage the flex circuit, the electronic devices that are mounted on or near the flex circuit, or both. Typically, increasing the electric power transmission rate in a flex circuit requires an increase in the conductive cross-sectional area and/or thermal dissipation.

Some embodiments address the electric power transmission and thermal dissipative capabilities of a retractable flex circuit assembly by providing integrated thermal energy dissipative elements to draw and disperse thermal energy. Hence, some embodiments allow for increased transmission of electric power at a given temperature specification or a decrease in the conductive cross sectional area necessary to maintain a specified flex circuit temperature.

Figure 1A:
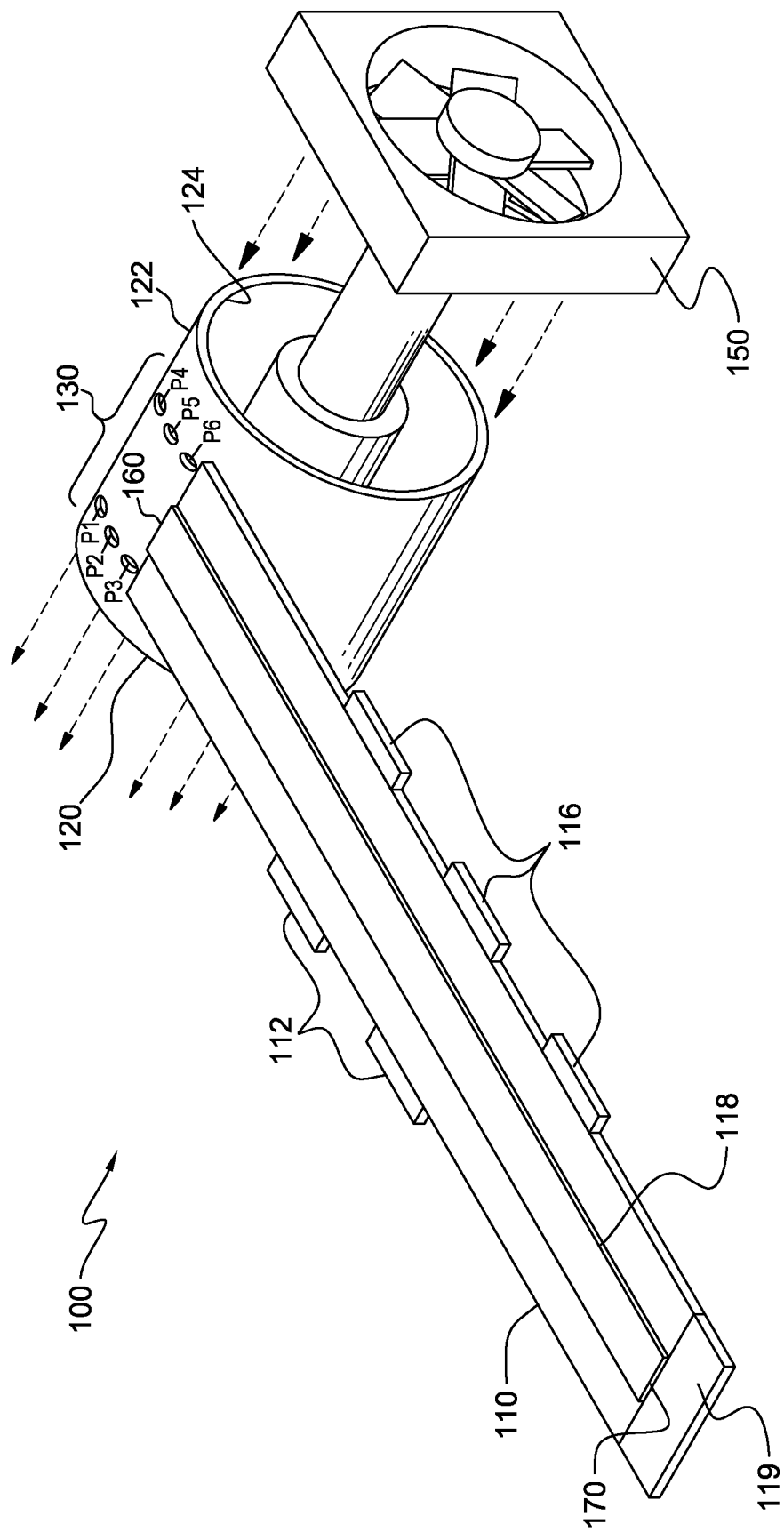
FIG. 1A illustrates a design structure, in accordance with an embodiment of the present invention.

The present invention will now be described with references to the Figures. FIG. 1A is a cross-section illustration of a retractable flex circuit assembly (RFCA), generally designated 100, in accordance with an embodiment of the present invention. RFCA 100 includes flex circuit 110 and retractor 120. Furthermore, flex circuit 110 includes distal end 170 and proximal end 160, which are associated with electronic component 119 and retractor 120, respectively. Flex circuit 110 represents a flexible electronic that not only includes a power and/or signal trace includes thermal dissipative characteristics that optimize heat transfer to the environment. For example, optimizing heat transfer can mean achieving a heat transfer rate greater than that achieved without including the thermal dissipative characteristics. Flex circuit 110 can include a conductive layer made of, for example, copper foil, beryllium copper, aluminum, inconel, or a conductive polymer thick film, to be discussed in further detail in relation to FIGS. 1B and 1C.

Flex circuit 110 includes a dielectric substrate that can act as an insulating layer, such as insulating layer 117, discussed below in reference to FIGS. 1B and 1C, for the conductive layer. For example, a dielectric substrate with a low dielectric constant, low dissipation factor, an ability to withstand high operating temperatures, and high insulation resistance and high surface resistivity. Applicable dielectrics include, but may not be limited to, polyimide films, polyester films, aramids, reinforced composites, and fluorocarbons. In a flex circuit, such as flex circuit 110, the dielectric substrate is the base film on which conductors may be fabricated. Furthermore, the dielectric substrate insulates conductors from each other and provides much of the mechanical strength of a flex circuit, such as flex circuit 110.

Figure 1B:
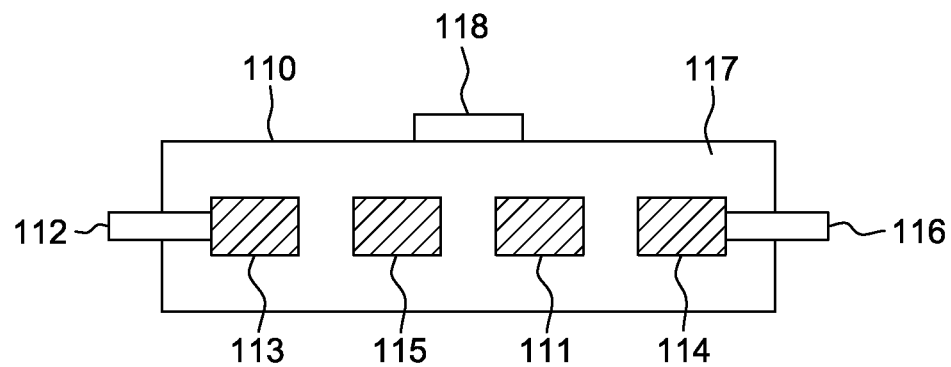
FIG. 1B is a cross-section illustration of the flexible circuit of FIG. 1A, in accordance with an embodiment of the present invention.
Figure 1C:
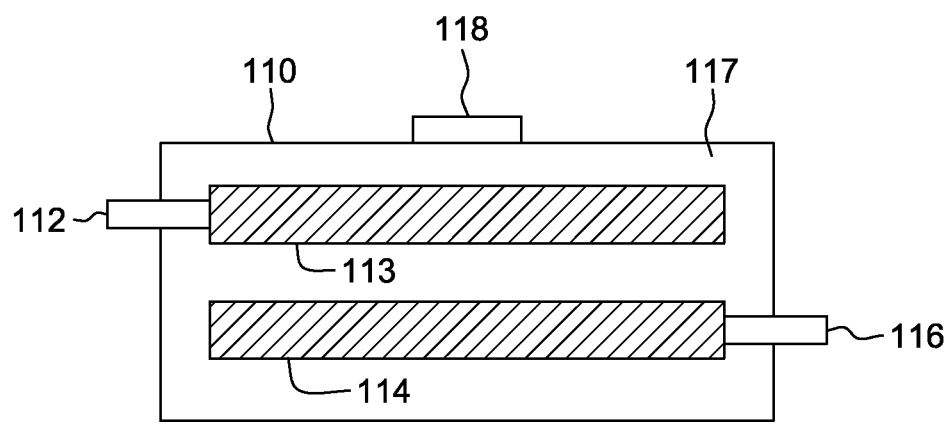
FIG. 1C is a cross-section illustration of the flexible circuit of FIG. 1A, in accordance with an embodiment of the present invention.

Further, flex circuit 110 includes a power and/or signal trace, discussed in further detail in relation to FIGS. 1B and 1C. As noted above, the transfer of electric power typically increases the thermal radiance of a flex circuit, such as flex circuit 110. Further still, flex circuit 110 includes thermal energy transfer turrets (turrets) 112 and/or 116, which are integrated thermal energy dissipative elements, to be discussed in further detail in reference to FIGS. 1B and 1C, positioned to improve thermal energy dissipation. Turrets 112 and 116 are spaced longitudinally along the peripheral edge of flex circuit 110, such that no two turrets sit directly on top of each other nor make contact with each other when flex circuit 110 is retracted around, for example, retractor 120. Alternatively, turrets 112 and 116 can be comprised of an electric insulator coating, for example, a dielectric. In an embodiment, turrets 112 and 116 are attached to flex circuit 110 near longitudinal conductors, such as conductors 113 and 114 (discussed in further detail in reference to FIGS. 1B and 1C). In an embodiment, turrets 112 and 116 adjacent to longitudinal conductors, such as conductors 113 and 114.

Further, flex circuit 110 may include riser element 118, which can be comprised of a material, for example, thin foam, polyimide, polyester, aramid, reinforced composite, or fluorocarbon. Riser element 118 can be positioned length-wise substantially near the center of the width of flex circuit 110 to allow a retractable flex circuit. For example, flexible circuit 110, when wound about retractor 120, has air space between wound layers of flex circuit 110 to promote thermal energy dissipation from two sides of flex circuit 110 instead of being in contact with the next layer. In an embodiment, riser element 118 can be coupled longitudinally to flex circuit 110. Riser element 118 can separate a plurality of layers of flex circuit 110 when flex circuit 110 is retracted around retractor 120. Flex circuit 110 can transfer a signal and/or power from one predefined location to another over longitudinal signal lines (not shown), for example, by including a signal and/or power trace (discussed above). In general, flex circuit 110 may be any retractable flexible circuit capable of being wound about retractor 120, that transmits an electric signal and/or electric power, and includes integrated thermal energy dissipative elements, in accordance with an embodiment of the present invention.

Electronic component 119 is coupled to distal end 160 of flex circuit 110 and represents an electronic substructure capable of connecting flex circuit 110 to an additional electronic component (not shown), for example, a circuit board. Further, electronic component 119 can allow flex circuit 110 to transfer electric power and/or an electric signal to the additional electronic component, in accordance with an embodiment of the present invention.

Retractor 120 is associated with flex circuit 110. Retractor 120 represents a grounded semi-hollow substantially cylindrical mechanism capable of retracting of a flex circuit, for example, flex circuit 110 around an exterior surface. Retractor 120 includes exterior surface 122, which is coupled to proximal end 160, and interior surface 124. Retractor 120 may include or be manufactured from a thermally conductive polymer. Further, retractor 120 may include heat sink 140 (discussed in further detail as per FIG. 1D) integrated into interior surface 124 to promote thermal dissipation of flex circuit 110 and/or retractor 120. Further still, retractor 120 can include radial ventilation holes between exterior surface 122 and interior surface 124 arranged in a perforation pattern, such as perforation pattern 130. Perforation pattern 130 includes perforations P1-P6. Perforation pattern 130 promotes air flow to the inside of a flex circuit, for example, flex circuit 110, when wound about retractor 120 to promote thermal energy dissipation. Specifically, perforation pattern 130 allows thermal energy to dissipate through retractor 120 towards interior surface 124 and out to the environment when flex circuit 110 is wound about retractor 120.

Although not shown, perforation pattern 130 may include additional perforations and/or an alternate perforation pattern than depicted to optimize (discussed above) thermal energy dissipation of a flex circuit, for example, flex circuit 110. For example, perforation pattern 130 can be positioned substantially adjacent to an area of relatively high thermal activity, for example, a power trace, to address the thermal energy generated therefrom. For example, perforation pattern 130 can be positioned substantially across the width of retractor 120. In addition, perforation pattern 130 may include perforations of non-uniform diametric widths. Furthermore, retractor 120 may be coupled to fan 150, which promotes thermal energy dissipation of flex circuit 110 and/or retractor 120. Fan 150 is coupled to retractor 120 in operable engagement with turrets 112 and 116. Although not shown, fan 150 may be positioned relative to retractor 120 in an alternative manner that promotes the thermal energy dissipation of flex circuit 110 and/or retractor 120. For example, fan 150 may be positioned such that air flow generated by fan 150 flows substantially crosswise over retractor 120

Perforation pattern 130 can be positioned in areas of retractor 120 where thermal energy is generated by a flex circuit, for example, flex circuit 110, when wound about retractor 120. For example, where flex circuit 110 is configured as in FIG. 1B with a power trace positioned substantially near the periphery of flex circuit 110, discussed below in further detail wherein longitudinal conductors, such as conductors 113 and 114, located substantially near the periphery of flex circuit 110, transmit power and concomitantly generate thermal energy, perforations P1-P6 can be positioned, similarly to conductors 113 and 114, substantially near the periphery of flex circuit 110 to address thermal energy dissipation needs. Alternatively, where flex circuit 110 is configured as in FIG. 1C wherein conductors 113 and 114 substantially span the width of flex circuit 110, perforations P1-P6 can be invented to work substantially across the width of conductors 113 and 114 to address thermal energy dissipation generated therein.

FIGS. 1B and 1C depict cross-sectional illustrations of flex circuit 110 of FIG. 1A, in accordance with embodiments of the present invention. In particular, FIG. 1B depicts a single-layered embodiment of flex circuit 110 that transmits a signal and power, in accordance with an embodiment of the present invention. In an alternative embodiment, a single-layered embodiment of flex circuit 110 may include additional conductors than those depicted therein, for example, conductors located along the top and/or bottom of flex circuit 110. As depicted in FIG. 1B, flex circuit 110 includes riser element 118, conductors 113 and 114, which are associated with turrets 112 and 116, respectively, conductors 115 and 111, and insulating layer 117, which can substantially cover not only conductors 113 and 114, but also turrets 112 and 116. Conductors 115 and 111 transmit an electronic signal and conductors 113 and 114 transmit electrical power. In an embodiment, turrets 112 and 116 are comprised of material that conductors 113 and 114, respectively, are comprised of. In an embodiment, turrets 112 and 116 are extensions of conductors 113 and 114, respectively. In an embodiment, turrets 112 and 116 are comprised of a thermal conductive material, for example, aluminum, copper, diamond, copper-tungsten, or E-Material.

Further, conductors 113 and 114 are positioned on the periphery of flex circuit 110 to allow for thermal energy dissipation via turrets 112 and 116, respectively. In an embodiment of the present invention, conductors involved in electric power transmission, for example, conductors 113 and 114 are positioned on the periphery of flex circuit 110 to facilitate thermal energy dissipation. Further still, insulating layer 117 can substantially cover conductors 113 and 114. Furthermore, insulating layer 117 can be reduced in thickness or eliminated over conductors 113 and 114 to provide additional reduction in thermal resistance.

FIG. 1C illustrates a multi-layered embodiment of flex circuit 110 that transmits electrical power. In an additional embodiment, a multi-layered embodiment of flex circuit 110 may include additional conductive layers than those depicted in FIG. 1C. Flex circuit 110 includes riser element 118, two conductive layers, conductors 113 and 114, which are associated with turrets 112 and turret 116, respectively. Further, turrets 112 and 116 are located adjacent to conductors 113 and 114. In an embodiment, turrets 112 and 116 may be extensions of conductors 113 and 114, respectively.

Figure 1D:
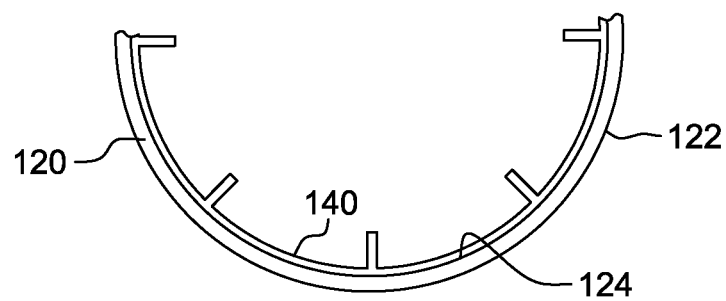
FIG. 1D is a side-view illustration of the flexible circuit of FIG. 1A, in accordance with an embodiment of the present invention.

FIG. 1D depicts a cross-sectional illustration of a retractor 120 of FIG. 1A, in accordance with an embodiment of the present invention. Specifically, FIG. 1D illustrates an embodiment of retractor 120 that includes heat sink 140 positioned adjacent to interior surface 124 to promote thermal energy dissipation. In an embodiment, heat sink 140 comprises a plurality of radial fins extending inwardly into an interior surface of retractor 120, for example, interior surface 124.

Figure 2:
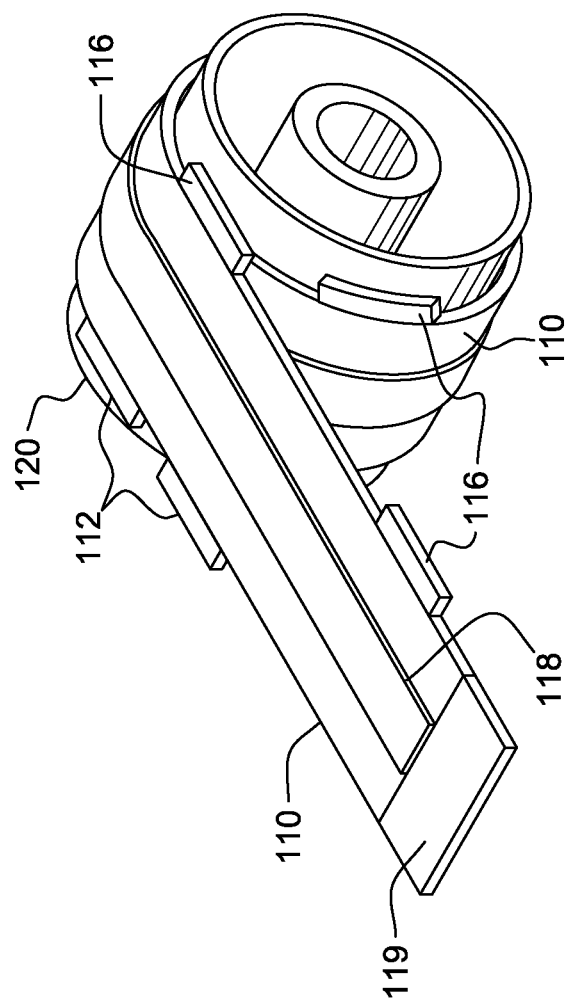
FIG. 2 is a depiction of an exemplary illustration of the flex circuit of FIG. 1A wound about the retractor of FIG. 1.

FIG. 2 depicts an exemplary illustration of flex circuit 110 wound about retractor 120. In particular, FIG. 2 depicts the positioning of turrets 112 and 116 as flex circuit 110 is wound about retractor 120. The positioning of turrets 112 and 116 is such that when flex circuit 110 is wrapped about retractor 120, each wrapped layer's turrets are exposed to air to promote thermal dissipation and no two turrets are positioned directly on top of each other.

Unless defined otherwise, all technical and scientific terms used herein have the same meaning as commonly understood by one of ordinary skill in the art. Although any materials similar or equivalent to those described herein can also be used in the practice or testing of the present invention, a limited number of the exemplary materials are described herein.

It must be noted that as used herein and in the appended claims, the singular forms "a", "an", and "the" include plural referents unless the context clearly dictates otherwise. It should be apparent, however, to those skilled in the art that many more modifications besides those already described are possible without departing from the inventive concepts herein. The inventive subject matter, therefore, is not to be restricted except in the spirit of the disclosure. Moreover, in interpreting the disclosure, all terms should be interpreted in the broadest possible manner consistent with the context. In particular, the terms "comprises" and "comprising" should be interpreted as referring to elements, components, or steps in a non-exclusive manner, indicating that the referenced elements, components, or steps may be present, or utilized, or combined with other elements, components, or steps that are not expressly referenced.

What is claimed is:

1. An apparatus, comprising:
   a flexible circuit having a proximal end, a distal end, and a plurality of longitudinal conductors;
   a substantially cylindrical retractor capable of retracting the flexible circuit around an exterior surface of the substantially cylindrical retractor; and
   a plurality of thermal energy transfer turrets attached to the flexible circuit near the plurality of longitudinal conductors.

2. The apparatus of claim 1, wherein the plurality of thermal energy transfer turrets are adjacent to the plurality of longitudinal conductors.

3. The apparatus of claim 1, wherein the retractor comprises a grounded, thermally conductive polymer.

4. The apparatus of claim 1, wherein the substantially cylindrical retractor comprises a plurality of radial ventilation holes between the exterior surface and an interior of the substantially cylindrical retractor arranged in a perforation pattern.

5. The apparatus of claim 4, wherein the perforation pattern is adjacent to an area of relatively high thermal activity in the flexible circuit.

6. The apparatus of claim 1, wherein flexible circuit comprises an insulating layer; and wherein the insulating layer comprises a dielectric substrate with at least one of the following characteristics: low dielectric constant, low dissipation factor, an ability to withstand high operating temperatures, a high insulation resistance, and high surface resistivity.

7. The apparatus of claim 6, wherein the insulating layer is chosen from a group consisting of: a polyimide film, a polyester film, an aramid, a reinforced composite, and a fluorocarbon.

8. The apparatus of claim 1, further comprising a fan coupled to the retractor in operable engagement with the plurality of thermal energy transfer turrets.

9. The apparatus of claim 1, further comprising a riser element coupled longitudinally to the flexible circuit, wherein the riser element separates a plurality of layers of the flexible circuit when the flexible circuit is retracted around the retractor.

10. The apparatus of claim 9, wherein the riser element is comprised of a material chosen from a group consisting of: a foam, a polyimide, a polyester, an aramid, a reinforced composite, or a fluorocarbon.

11. The apparatus of claim 1, further comprising a heat sink integrated into an interior surface of the substantially cylindrical retractor.

12. The apparatus of claim 11, wherein the heat sink comprises a plurality of radial fins extending inwardly from the interior surface.

13. The apparatus of claim 1, wherein the plurality of thermal energy transfer turrets are positioned to improve thermal energy dissipation.

14. The apparatus of claim 1, wherein the plurality of thermal energy transfer turrets are spaced longitudinally along a peripheral edge of the flexible circuit such that none of the plurality of thermal energy transfer turrets is in contact with another turret when the flexible circuit is retracted around the retractor.

15. The apparatus of claim 1, further comprising an electric insulator coating the plurality of thermal energy transfer turrets.

16. The apparatus of claim 1, wherein the plurality of thermal energy transfer turrets comprises material that a longitudinal conductor included in the plurality of longitudinal conductors is comprised of.

17. The apparatus of claim 1, wherein the plurality of thermal energy transfer turrets comprises extensions of a longitudinal conductor included in the plurality of longitudinal conductors.

18. The apparatus of claim 1, wherein the plurality of thermal energy transfer turrets comprises material chosen from a group consisting of:
aluminum; copper; diamond; copper-tungsten; dymalloy; E-Material; and a thermal conductive material.

19. An apparatus, comprising:
a flexible circuit having a proximal end, a distal end, and a plurality of longitudinal conductors;
a substantially cylindrical retractor capable of retracting the flexible circuit around an exterior surface of the substantially cylindrical retractor, wherein the retractor comprises a grounded, thermally conductive polymer, wherein the retractor comprises a plurality of radial ventilation holes between the exterior surface and an interior of the retractor arranged in a perforation pattern;
a plurality of thermal energy transfer turrets attached to the flexible circuit near the plurality of longitudinal conductors, wherein the plurality of thermal energy transfer turrets are positioned to improve thermal energy dissipation, wherein the plurality of thermal energy transfer turrets are spaced longitudinally along a peripheral edge of the flexible circuit such that none of the plurality of thermal energy transfer turrets is in contact with another turret when the flexible circuit is retracted around the retractor, wherein the plurality of thermal energy transfer turrets comprises material that a longitudinal conductor included in the plurality of longitudinal conductors is comprised of, wherein the plurality of thermal energy transfer turrets comprises extensions of the longitudinal conductor included in the plurality of longitudinal conductors, wherein the plurality of thermal energy transfer turrets comprises: material chosen from a group consisting of: aluminum, copper, diamond, copper-tungsten, dymalloy, E-Material, and a thermal conductive material;
a fan coupled to the retractor in operable engagement with the plurality of thermal energy transfer turrets;
a riser element coupled longitudinally to the flexible circuit, wherein the riser element separates a plurality of layers of the flexible circuit when the flexible circuit is retracted around the retractor, wherein the riser element is comprised of a material chosen from a group consisting of: a foam, a polyimide, a polyester, an aramid, a reinforced composite, or a fluorocarbon;
a heat sink integrated into an interior surface of the retractor, wherein the heat sink comprises a plurality of radial fins extending inwardly from the interior surface; and
an electric insulator coating the plurality of thermal energy transfer turrets;
wherein the perforation pattern is adjacent to an area of relatively high thermal activity in the flexible circuit;
wherein flexible circuit comprises an insulating layer, wherein the insulating layer comprises a dielectric substrate with at least one of the following characteristics: low dielectric constant, low dissipation factor, an ability to withstand high operating temperatures, a high insulation resistance, and high surface resistivity; and
wherein the insulating layer is chosen from a group consisting of: a polyimide film; a polyester film; an aramid; a reinforced composite; and a fluorocarbon.

* * * * *